US010033341B2

(12) United States Patent
Joish

(10) Patent No.: US 10,033,341 B2
(45) Date of Patent: *Jul. 24, 2018

(54) PROGRAMMABLE IMPEDANCE NETWORK IN AN AMPLIFIER

(71) Applicant: Texas Instruments Incorporated, Dallas, TX (US)

(72) Inventor: Rajendrakumar Joish, Bangalore (IN)

(73) Assignee: TEXAS INSTRUMENTS INCORPORATION, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/464,091

(22) Filed: Mar. 20, 2017

(65) Prior Publication Data

US 2017/0194923 A1    Jul. 6, 2017

Related U.S. Application Data

(63) Continuation of application No. 15/254,894, filed on Sep. 1, 2016, now Pat. No. 9,602,069, which is a (Continued)

(30) Foreign Application Priority Data

Sep. 16, 2014  (IN) .......................... 4515/CHE/2014

(51) Int. Cl.
*H03G 1/00* (2006.01)
*H03F 3/45* (2006.01)
*H04B 1/10* (2006.01)

(52) U.S. Cl.
CPC ....... *H03G 1/0082* (2013.01); *H03F 3/45085* (2013.01); *H04B 1/1036* (2013.01);
(Continued)

(58) Field of Classification Search
USPC ...... 375/219, 211, 240, 240.26–240.27, 254, 375/257, 258, 259, 285, 295, 296, 297,
(Continued)

(56) References Cited

U.S. PATENT DOCUMENTS 7,061,273 B2 * 6/2006 Wang ............... H03K 19/01858
326/68
7,151,393 B2 * 12/2006 Stein ....................... G11B 5/02
327/110
(Continued)

OTHER PUBLICATIONS

Prosecution History from U.S. Appl. No. 15/254,894, dated Sep. 1, 2016 to Mar. 2, 2017, 250 pages.
(Continued)

*Primary Examiner* — Linda Wong
(74) *Attorney, Agent, or Firm* — John R. Pessetto; Charles A. Brill; Frank D. Cimino

(57) ABSTRACT

The disclosure provides an amplifier. The amplifier includes a first transistor that receives a first input. A second transistor receives a second input. A plurality of impedance networks is coupled between the first transistor and the second transistor. At least one impedance network of the plurality of impedance networks includes a first impedance path and a second impedance path. The first impedance path is activated during single ended operation, and the second impedance path is activated during differential operation.

19 Claims, 6 Drawing Sheets

Figure 1:
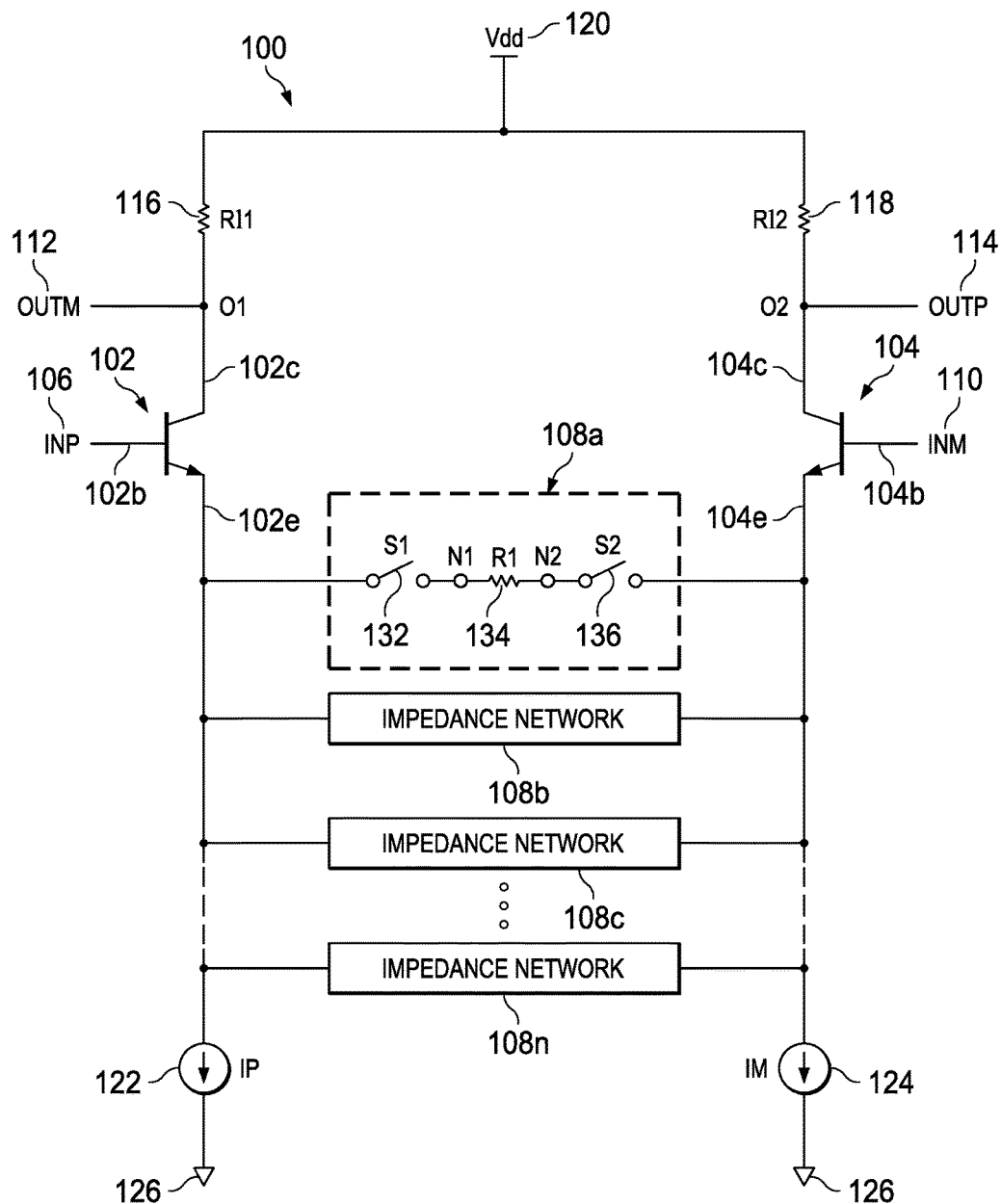

Related U.S. Application Data continuation of application No. 14/843,045, filed on Sep. 2, 2015, now abandoned.

(52) U.S. Cl.
CPC .................. *H03F 2200/294* (2013.01); *H03F 2203/45026* (2013.01)

(58) Field of Classification Search
USPC ....... 375/316, 318, 317, 346, 349, 220, 221,
375/222, 300, 302, 319, 320, 345;
455/141, 143, 130, 140, 232.1, 253.1,
455/253.2, 254, 323, 333; 330/4.5, 4.9,
330/7, 250, 253, 255, 262, 264, 269, 277,
330/278, 300, 307
See application file for complete search history.

(56) References Cited

U.S. PATENT DOCUMENTS

| | | | | |
|---|---|---|---|---|
| 7,202,708 B2* | 4/2007 | Luh | ........................ | H03K 3/288 327/65 |
| 7,230,504 B1* | 6/2007 | Marques | .............. | H03B 5/1228 331/117 FE |
| 2004/0080369 A1* | 4/2004 | Pradhan | .............. | H03F 3/45219 330/253 |
| 2004/0246026 A1* | 12/2004 | Wang | ............. | H03K 19/018585 326/86 |
| 2007/0222425 A1* | 9/2007 | Kimura | ..................... | G05F 1/46 323/315 |
| 2009/0124223 A1* | 5/2009 | Kyranas | ................. | H03D 3/007 455/143 |
| 2009/0185406 A1* | 7/2009 | Uno | ........................ | H03F 3/005 363/131 |
| 2011/0319042 A1* | 12/2011 | Soman | ..................... | H04B 1/18 455/205 |
| 2012/0176200 A1* | 7/2012 | Hajimiri | ............... | H03F 1/0211 330/297 |
| 2012/0295556 A1* | 11/2012 | Chien | ....................... | H03F 1/56 455/78 |
| 2012/0321020 A1* | 12/2012 | Eldesouki | ............ | H03D 7/1441 375/318 |
| 2013/0002338 A1* | 1/2013 | Kondo | ................ | H01L 27/0207 327/419 |
| 2014/0009233 A1* | 1/2014 | Cabrera | ................ | H03F 1/0277 330/273 |
| 2014/0070719 A1* | 3/2014 | Lee | .................... | H05B 33/0815 315/210 |
| 2014/0203872 A1* | 7/2014 | Sjoland | ................... | H03F 1/303 330/252 |
| 2014/0266312 A1* | 9/2014 | Lin | ....................... | H03K 5/2481 327/74 |
| 2014/0299875 A1* | 10/2014 | Umezaki | ................ | G09G 3/325 257/43 |
| 2014/0312937 A1* | 10/2014 | Ehlers | .................... | H03B 19/14 327/119 |
| 2014/0327482 A1* | 11/2014 | Ding | ........................ | H03F 1/302 330/256 |
| 2015/0008850 A1* | 1/2015 | Zhao | .................... | B60L 11/1816 318/139 |
| 2015/0065043 A1 | 3/2015 | Heng et al. | | |
| 2015/0077193 A1* | 3/2015 | Tsuhara | .................. | H03L 7/099 331/36 C |
| 2015/0171814 A1* | 6/2015 | Pai | ........................... | H04B 1/16 455/241.1 |
| 2016/0065134 A1* | 3/2016 | Lu | ........................... | H03F 1/523 330/251 |
| 2016/0071553 A1* | 3/2016 | Irizarry | ............. | G11C 13/0038 365/189.011 |

OTHER PUBLICATIONS

Prosecution History from U.S. Appl. No. 14/843,045, dated Sep. 2, 2015 to Jun. 1, 2016 (120 pages).

* cited by examiner

US 10,033,341 B2

PROGRAMMABLE IMPEDANCE NETWORK IN AN AMPLIFIER

CROSS REFERENCES TO RELATED APPLICATIONS

This application is a continuation of U.S. patent application Ser. No. 15/254,894, filed Sep. 1, 2016, which is a continuation of U.S. patent application Ser. No. 14/843,045, filed Sep. 2, 2015, now abandoned, which claims priority to India provisional patent application No. 4515/CHE/2014 filed on Sep. 16, 2014, all of which are hereby incorporated by reference in their entirety.

TECHNICAL FIELD

The present disclosure is generally related to amplifiers, and more particularly to use of low noise amplifiers for signal processing applications such as optical time domain reflectometry (OTDR).

BACKGROUND

An amplifier is utilized in various applications of remote sensing and communication equipment. Applications of the amplifier include radar, ultrasound, wireless communication and even speech analysis. These applications use the amplifier to enhance dynamic performance. An amplifier is categorized as low noise amplifier (LNA), variable gain amplifier (VGA) and programmable gain amplifier (PGA). Each of these amplifiers is used to sense and amplify low level signals.

The low noise amplifiers (LNAs) are used in receivers to amplify radio frequency (RF) signals received by a receive antenna. LNAs which are required to present a high input impedance have a V2I (voltage to current) architecture followed by an I2V (current to voltage) architecture. A gain programmability of the LNA is incorporated into the V2I architecture so as to maintain similar signal current level and signal to noise ratio (SNR) across different values of the gain.

Depending on signal frequency, an LNA can be implemented as an open loop or closed-loop amplifier. LNA input and output connections can be single-ended or differential. When the LNA is used both in single-ended and differential modes, a set of switches used in the V2I architecture invariably see a large voltage swing which degrades linearity of the LNA.

SUMMARY

According to an aspect of the disclosure, an amplifier is disclosed. The amplifier includes a first transistor that receives a first input. A second transistor receives a second input. A plurality of impedance networks is coupled between the first transistor and the second transistor. At least one impedance network of the plurality of impedance networks includes a first impedance path and a second impedance path. The first impedance path is activated during single ended operation, and the second impedance path is activated during differential operation.

BRIEF DESCRIPTION OF THE VIEWS OF DRAWINGS

Figure 2:
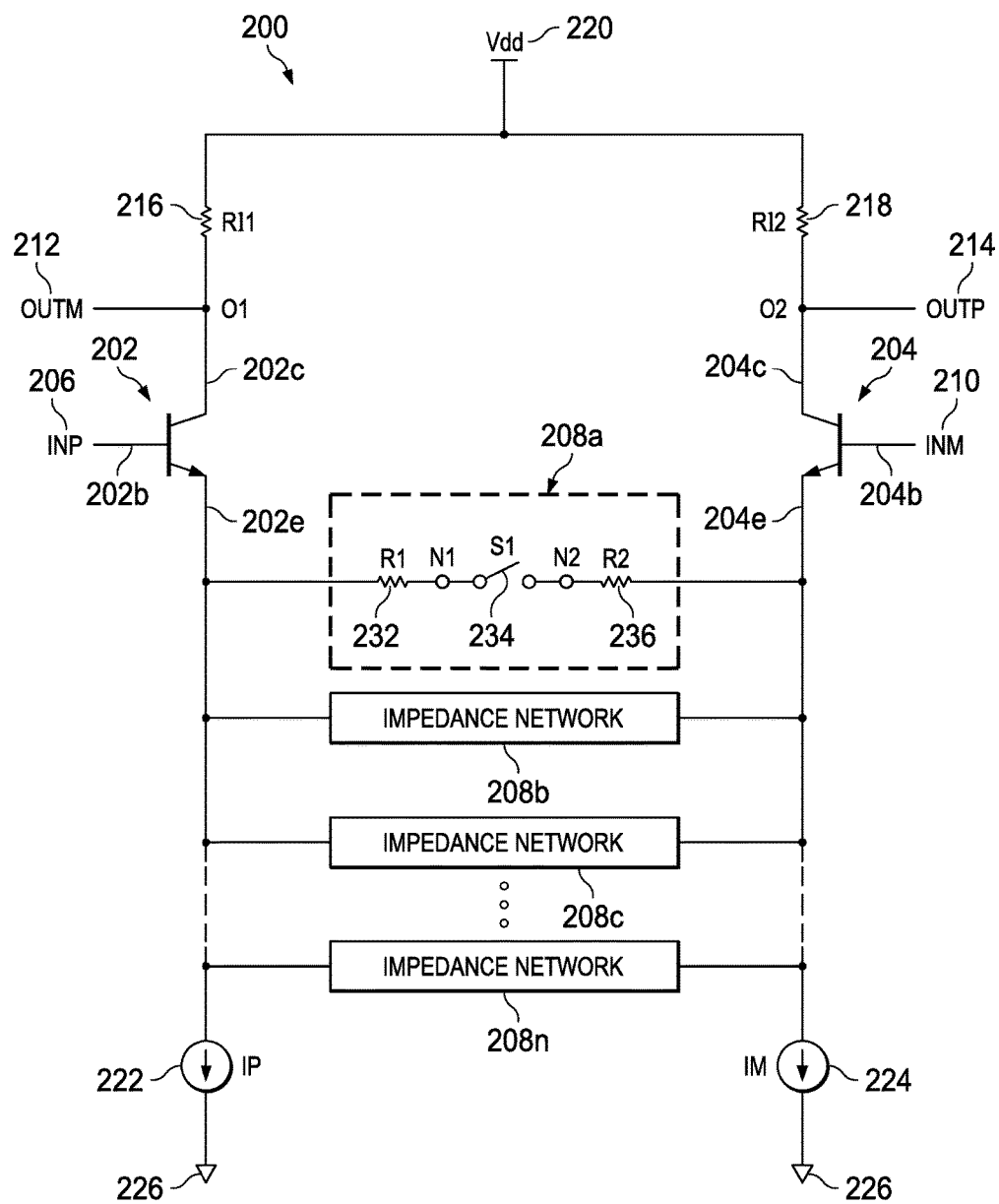
Figure 3:
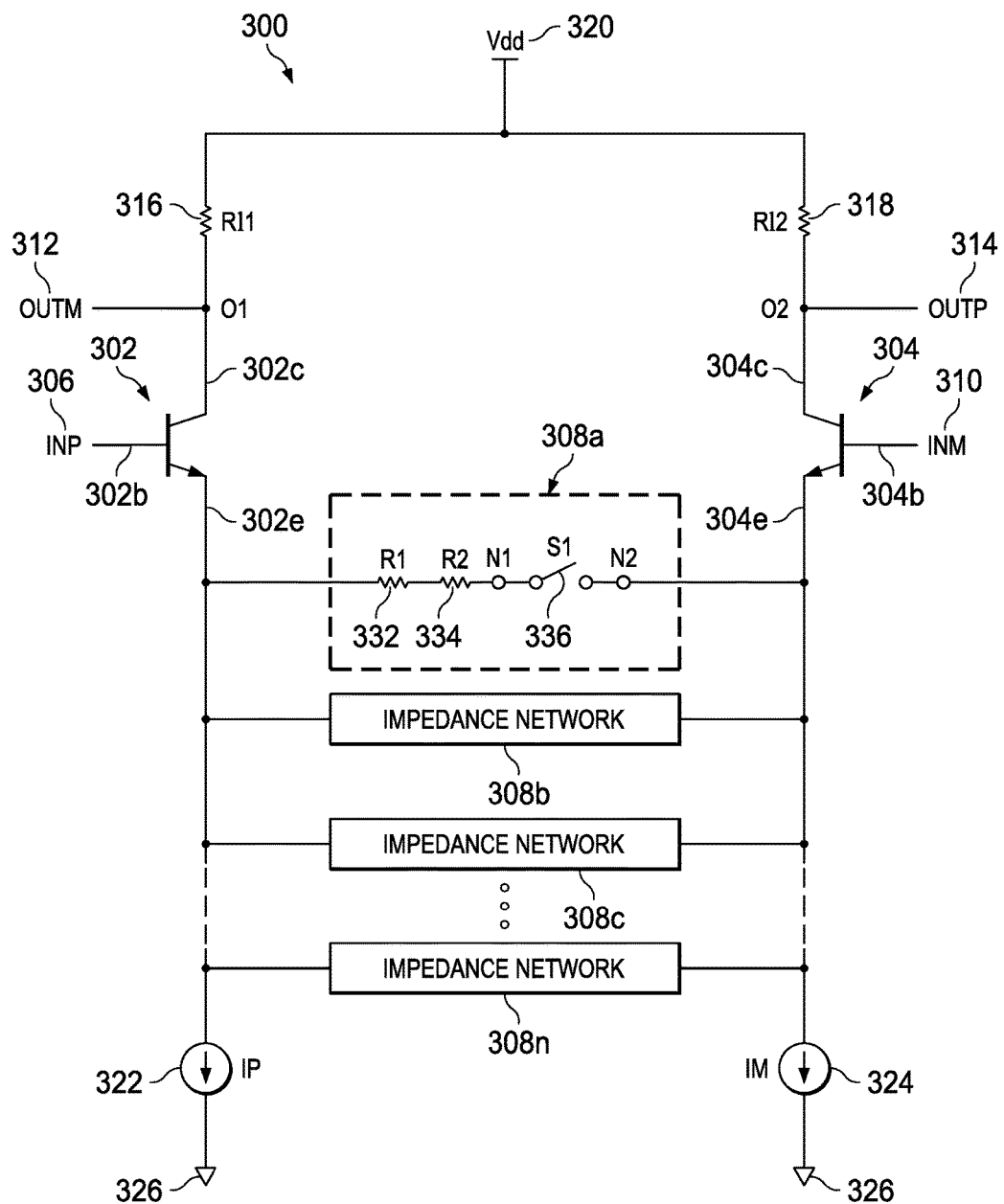
Figure 4:
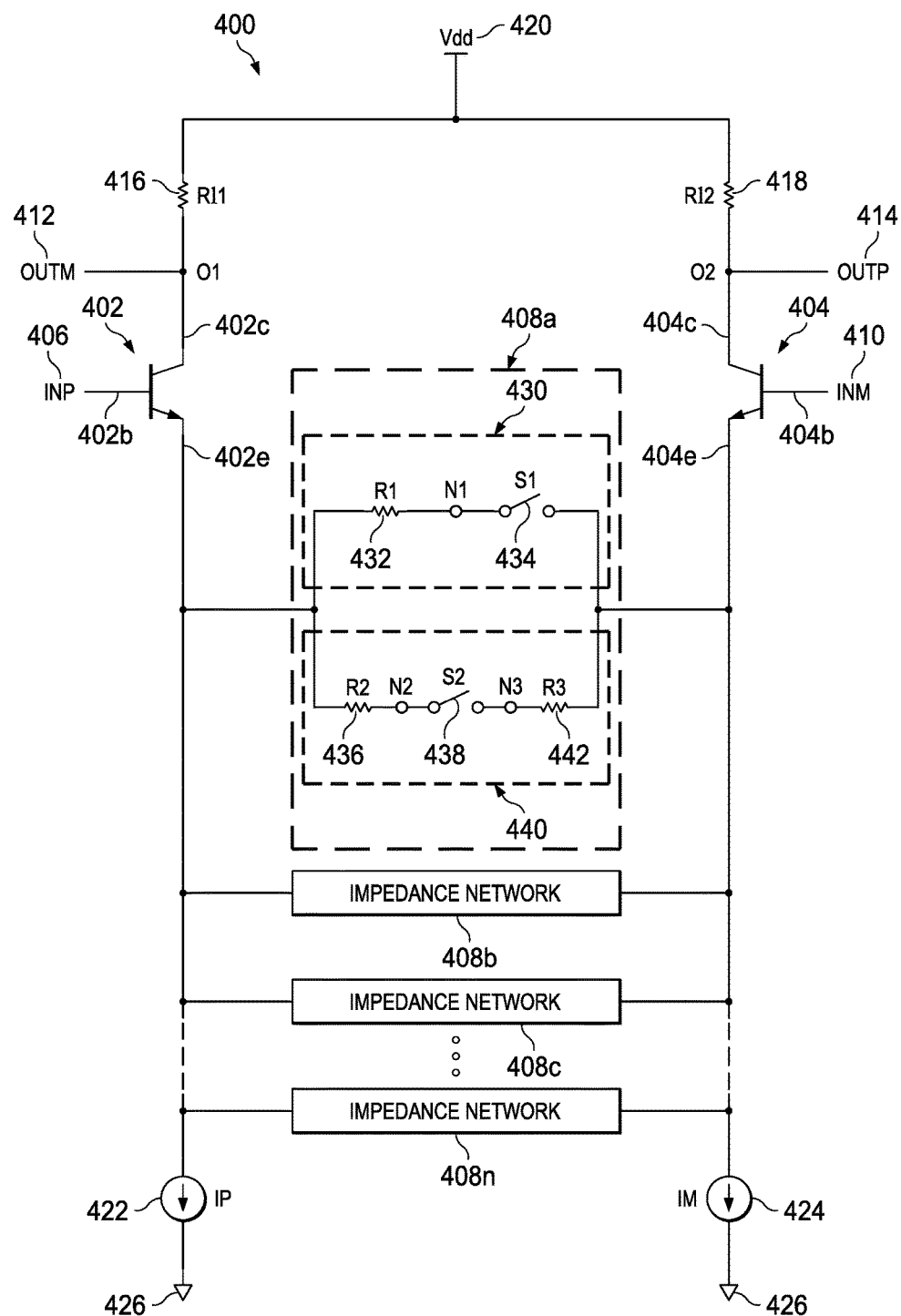
Figure 5:
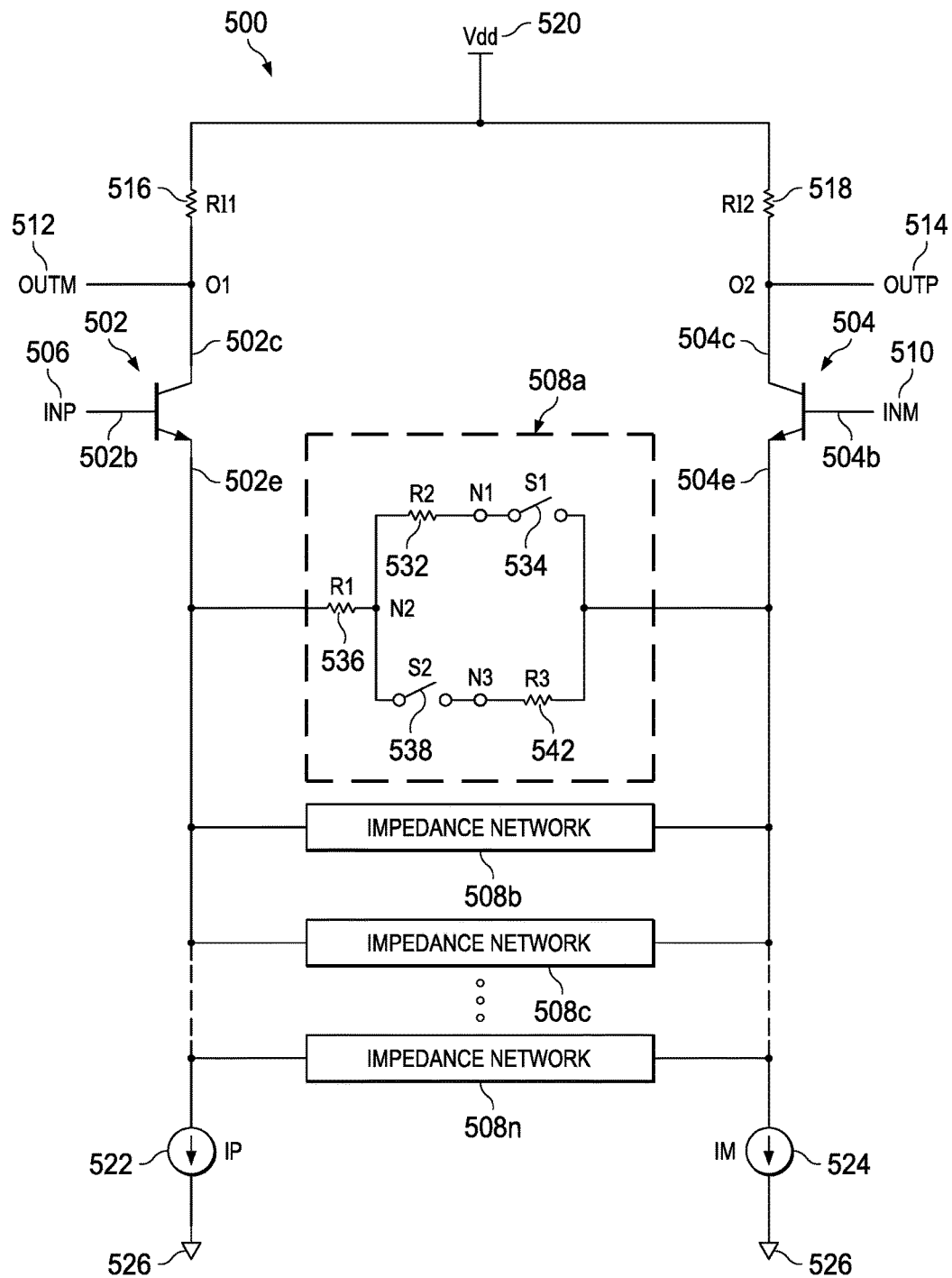
Figure 6:
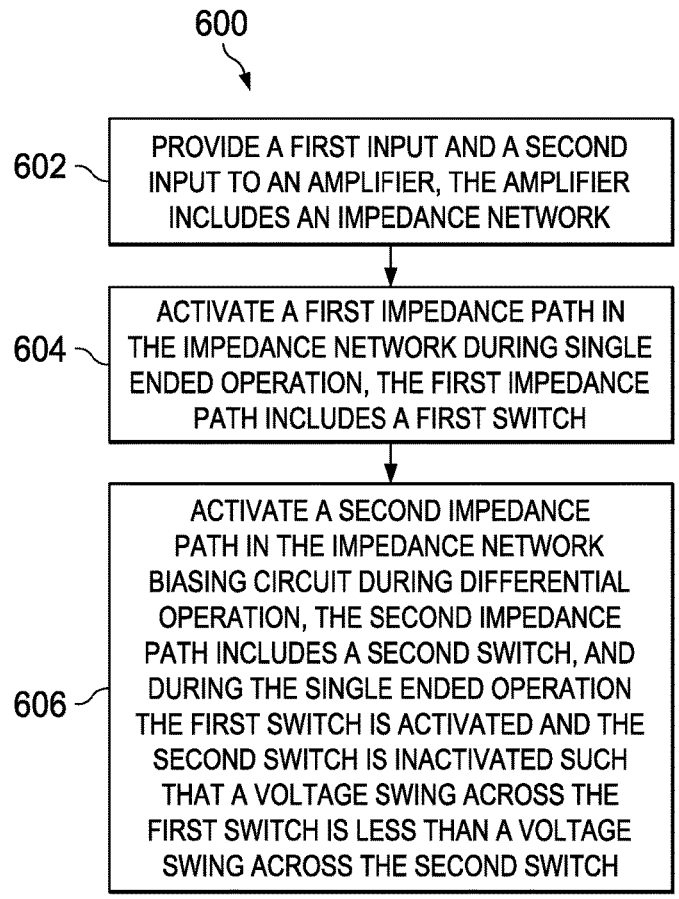
Figure 7:
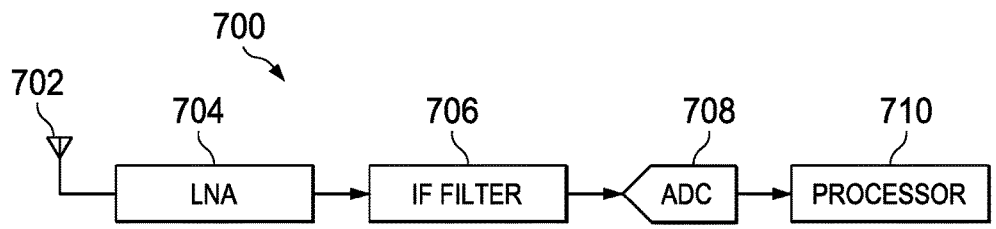

FIG. 1 illustrates an amplifier;
FIG. 2 illustrates an amplifier;
FIG. 3 illustrates an amplifier;
FIG. 4 illustrates an amplifier, according to an embodiment;
FIG. 5 illustrates an amplifier, according to an embodiment;
FIG. 6 is a flowchart illustrating a method, according to an embodiment; and
FIG. 7 is a block diagram illustrating an example receiver in which several aspects of the present invention can be implemented.

DETAILED DESCRIPTION OF THE EMBODIMENTS

FIG. 1 illustrates an amplifier 100. The amplifier 100, in one example, is a low noise amplifier. The amplifier 100 includes a first transistor 102 and a second transistor 104. The first transistor 102 receives a first input INP 106, and the second transistor 104 receives a second input INM 110. The amplifier 100 includes a plurality of impedance networks represented as 108a, 108b, 108c to 108n. The plurality of impedance networks is coupled between the first transistor 102 and the second transistor 104.

The first transistor 102 is an NPN transistor whose base terminal 102b receives the first input INP 106, and whose emitter terminal 102e is coupled to the plurality of impedance networks. A collector terminal 102c of the first transistor 102 is coupled to a power supply Vdd 120 through a first load resistor R11 116. A first biasing current source IP 122 is coupled between the emitter terminal 102e of the first transistor 102 and a ground terminal 126.

The second transistor 104 is an NPN transistor whose base terminal 104b receives the second input INM 110 and whose emitter terminal 104e is coupled to the plurality of impedance networks. A collector terminal 104c of the second transistor 104 is coupled to the power supply Vdd 120 through a second load resistor R12 118. A second biasing current source IM 124 is coupled between the emitter terminal 104e of the second transistor 104 and the ground terminal 126.

A first output node O1 is coupled between the first load resistor R11 116 and the collector terminal 102c of the first transistor 102. A second output node 02 is coupled between the second load resistor R12 and the collector terminal 104c of the second transistor 104. A first output OUTM 112 is generated at the first output node O1, and a second output OUTP 114 is generated at the second output node O2.

The plurality of impedance networks 108a, 108b, 108c to 108n are similar in connection and operation. For the sake of brevity of the description, the connection and operation of the impedance network 108a is described in detail. The impedance network 108a includes a first switch S1 132, a first resistor R1 134 and a second switch S2 136.

The first switch S1 132 is coupled between the first transistor 102 and a first node N1. The first resistor R1 134 is coupled between the first node N1 and a second node N2. The second switch S2 136 is coupled between the second node N2 and the second transistor 104. The first load resistor R11 116 and the second load resistor R12 118 form an I2V (current to voltage) architecture of the amplifier 100.

The first transistor 102, the second transistor 104 and the plurality of impedance networks 108a, 108b, 108c to 108n form a V2I (voltage to current) architecture. A gain of the amplifier is defined as a ratio of a resistance of first load resistor R11 116 and an effective single ended impedance of the plurality of impedance networks. The gain programmability of the amplifier 100 is incorporated into the V2I architecture so as to maintain similar signal current level and signal to noise ratio (SNR) across different values of the gain.

The operation of the amplifier 100 illustrated in FIG. 1 is explained now. In one example, a voltage level used to discuss operation of the amplifier 100 is with respect to a common mode voltage. In another example, the first input INP 106 and the second input INM 110 are biased to the common voltage. The amplifier 100 is capable of single ended operation and differential operation. During the single ended operation, the first input INP 106 is greater than the second input INM 110. For example, the first input INP 106 is at a defined voltage level above common mode voltage, and the second input INM 110 is at common mode voltage. In one example, during the single ended operation, the first input INP 106 is less than the second input INM 110. During the differential operation, the first input INP 106 and the second input INM 110 are differential signals. For example, the first input INP 106 is at V/2 and the second input INM 110 is at −V/2, where V is a voltage level.

Each of the first switch S1 132 and the second switch S2 136 is a MOS transistor. When activated, each of these switches has an ON switch resistance (Rsw). Each of these switches has an associated switch capacitance (Csw). A swing in a voltage across the impedance network 108a causes variations in the ON switch resistance (Rsw) and switch capacitance (Csw). This variation in the ON switch resistance (Rsw) causes a distorted voltage across the switch. For example, when the switch is a MOS transistor, a swing across the switch is at least one of swing across source-drain terminal, swing across gate-source terminal and swing across gate-drain terminal. A linearity degradation of a switch due to variation of the ON switch resistance (Rsw) causes much more distortion than the variation of the switch capacitance (Csw) at low frequencies.

During the differential operation, the first input INP 106 is at V/2 and the second input INM 110 is at −V/2, where V is a voltage level. In differential operation, when both the first switch S1 132 and the second switch S2 136 are activated, a voltage at the first node N1 is V/2, and a voltage at the second node N2 is −V/2. In differential operation, when both the first switch S1 132 and the second switch S2 136 are inactivated, the first node N1 and the second node N2 are biased to a bias voltage through a switch. Thus, a voltage at the first node N1 is and a voltage at the second node N2 is equal to the bias voltage, which in one case is 0 volt.

In differential operation, the voltage swing across the impedance network 108a is a large voltage swing. It causes a voltage swing across both the first switch S1 132 and the second switch S2 136. This voltage swing across the first switch S1 132 and the second switch S2 136 results in the ON switch resistance (Rsw) and switch capacitance (Csw) non-linearites. The variation of the ON switch resistance (Rsw) causes much more distortion than the variation of the switch capacitance (Csw). This degrades the performance of the amplifier 100.

In single ended operation, the first input INP 106 is at V volt and the second input INM 110 is at 0 volt. In single ended operation, when both the first switch S1 132 and the second switch S2 136 are activated, a voltage at the first node N1 is V, and a voltage at the second node N2 is 0. In single ended operation, when both the first switch S1 132 and the second switch S2 136 are inactivated, the first node N1 and the second node N2 are biased to a bias voltage. Thus, a voltage at the first node N1 is and a voltage at the second node N2 is equal to the bias voltage, which in one case is 0 volt.

In single ended operation, the voltage swing across the impedance network 108a is a large voltage swing. It causes a voltage swing across both the first switch S1 132 and the second switch S2 136. This voltage swing across the first switch S1 132 and the second switch S2 136 results in the ON switch resistance (Rsw) and switch capacitance (Csw) non-linearites. The variation of the ON switch resistance (Rsw) causes much more distortion than the variation of the switch capacitance (Csw). This degrades the performance of the amplifier 100.

In addition, the first switch S1 132 and the second switch S2 136 require bootstrapping both in differential operation and single ended operation. Bootstrapping is driving a gate terminal of the MOS transistor to track the voltage swing. Bootstrapping requires an additional power source, and a complex circuit to support these switches. Also, a size of each of the first switch S1 132 and the second switch S2 136 required in amplifier 100 is large. Thus, the amplifier 100 has multiple drawbacks which make its use for purpose of amplification unfavorable.

FIG. 2 illustrates an amplifier 200. The amplifier 200, in one example, is a low noise amplifier. The amplifier 200 includes a first transistor 202 and a second transistor 204. The first transistor 202 receives a first input INP 206, and the second transistor 204 receives a second input INM 210. The amplifier 200 includes a plurality of impedance networks represented as 208a, 208b, 208c to 208n. The plurality of impedance networks is coupled between the first transistor 202 and the second transistor 204.

The first transistor 202 is an NPN transistor whose base terminal 202b receives the first input INP 206, and whose emitter terminal 202e is coupled to the plurality of impedance networks. A collector terminal 202c of the first transistor 202 is coupled to a power supply Vdd 220 through a first load resistor R11 216. A first biasing current source IP 222 is coupled between the emitter terminal 202e of the first transistor 202 and a ground terminal 226.

The second transistor 204 is an NPN transistor whose base terminal 204b receives the second input INM 210 and whose emitter terminal 204e is coupled to the plurality of impedance networks. A collector terminal 204c of the second transistor 204 is coupled to the power supply Vdd 220 through a second load resistor R12 218. A second biasing current source IM 224 is coupled between the emitter terminal 204e of the second transistor 204 and the ground terminal 226.

A first output node O1 is coupled between the first load resistor R11 216 and the collector terminal 202c of the first transistor 202. A second output node O2 is coupled between the second load resistor R12 and the collector terminal 204c of the second transistor 204. A first output OUTM 212 is generated at the first output node O1, and a second output OUTP 214 is generated at the second output node O2.

The plurality of impedance networks 208a, 208b, 208c to 208n are similar in connection and operation. For the sake of brevity of the description, the connection and operation of the impedance network 208a is described in detail. The impedance network 208a includes a first resistor R1 232, a first switch S1 234 and a second resistor R2 236. In one example, a resistance of the first resistor R1 232 and the second resistor R2 236 are equal.

The first resistor R1 232 is coupled between the first transistor 202 and a first node N1. The first switch S1 234 is coupled between the first node N1 and a second node N2.

The second resistor R2 236 is coupled between the second node N2 and the second transistor 204. The first load resistor R11 216 and the second load resistor R12 218 form an I2V (current to voltage) architecture of the amplifier 200.

The first transistor 202, the second transistor 204 and the plurality of impedance networks 208a, 208b, 208c to 208n form a V2I (voltage to current) architecture. A gain of the amplifier 200 is defined as a ratio of a resistance of the first load resistor R11 216 and an effective single ended impedance of the plurality of impedance networks. The gain programmability of the amplifier 200 is incorporated into the V2I architecture so as to maintain similar signal current level and signal to noise ratio (SNR) across different values of the gain.

The operation of the amplifier 200 illustrated in FIG. 2 is explained now. In one example, a voltage level used to discuss operation of the amplifier 200 is with respect to a common mode voltage. In another example, the first input INP 206 and the second input INM 210 are biased to the common voltage. The amplifier 200 is capable of single ended operation and differential operation. During the single ended operation, the first input INP 206 is greater than the second input INM 210. For example, the first input INP 206 is at a defined voltage level above common mode voltage, and the second input INM 210 is at common mode voltage. In one example, during the single ended operation, the first input INP 206 is less than the second input INM 210. During the differential operation, the first input INP 206 and the second input INM 210 are differential signals. For example, the first input INP 206 is at V/2 and the second input INM 210 is at −V/2, where V is a voltage level.

The first switch S1 234 is a MOS transistor. When activated, the first switch S1 234 has an ON switch resistance (Rsw). The first switch S1 234 has an associated switch capacitance (Csw). A swing in a voltage across the impedance network 208a causes variations in the ON switch resistance (Rsw) and switch capacitance (Csw). This variation in the ON switch resistance (Rsw) causes a distorted voltage across the first switch S1 234. For example, when the first switch S1 234 is a MOS transistor, a swing across the first switch S1 234 is at least one of swing across source-drain terminal, swing across gate-source terminal and swing across gate-drain terminal. A linearity degradation of the first switch S1 234 due to variation of the ON switch resistance (Rsw) causes much more distortion than the variation of the switch capacitance (Csw) at low frequencies.

During the differential operation, the first input INP 206 is at V/2 and the second input INM 210 is at −V/2, where V is a voltage level. In differential operation, when the first switch S1 234 is activated, a voltage at the first node N1 is 0 volt, and a voltage at the second node N2 is 0 volt. Thus, there is no voltage swing across the first switch S1 234, and hence no ON switch resistance (Rsw) and switch capacitance (Csw) non-linearites.

In differential operation, when the first switch S1 234 is inactivated, a voltage at the first node N1 is V/2, and a voltage at the second node N2 is −V/2. Thus, in this case, a large voltage swing exists across the first switch S1 234. Since, the first switch S1 234 is inactivated, a non-linearity due to the ON switch resistance (Rsw) does not exist and a non-linearity due to the switch capacitance (Csw) is negligible at low frequencies. Hence, this does not degrade the performance of the amplifier 200.

In single ended operation, the first input INP 206 is at V volt and the second input INM 210 is at 0 volt. In single ended operation, when the first switch S1 234 is activated, a voltage at the first node N1 is V/2, and a voltage at the second node N2 is V/2. Thus, in this case, half swing exists across the first switch S1 234. This results in the ON switch resistance (Rsw) and the switch capacitance (Csw) non-linearites. The variation of the ON switch resistance (Rsw) causes much more distortion than the variation of the switch capacitance (Csw). This degrades the performance of the amplifier 200.

In single ended operation, when the first switch S1 234 is inactivated, a voltage at the first node N1 is V, and a voltage at the second node N2 is 0 volt. Thus, in this case, a large voltage swing exists across the first switch S1 234. Since, the first switch S1 234 is inactivated, a non-linearity due to the ON switch resistance (Rsw) does not exist and a non-linearity due to the switch capacitance (Csw) is negligible at low frequencies. Hence, this does not degrade the performance of the amplifier 200.

In differential operation, the first switch S1 234 does not require bootstrapping. However, in single ended operation, the first switch S1 234 requires bootstrapping. Bootstrapping is driving a gate terminal of the MOS transistor to track the voltage swing. Bootstrapping requires an additional power source, and a complex circuit to support the first switch S1 234. Thus, the amplifier 200 has multiple drawbacks which make its use for purpose of amplification unfavorable.

FIG. 3 illustrates an amplifier 300. The amplifier 300, in one example, is a low noise amplifier. The amplifier 300 includes a first transistor 302 and a second transistor 304. The first transistor 302 receives a first input INP 306, and the second transistor 304 receives a second input INM 310. The amplifier 300 includes a plurality of impedance networks represented as 308a, 308b, 308c to 308n. The plurality of impedance networks is coupled between the first transistor 302 and the second transistor 304.

The first transistor 302 is an NPN transistor whose base terminal 302b receives the first input INP 306, and whose emitter terminal 3026e is coupled to the plurality of impedance networks. A collector terminal 302c of the first transistor 302 is coupled to a power supply Vdd 320 through a first load resistor R11 316. A first biasing current source IP 322 is coupled between the emitter terminal 302e of the first transistor 302 and a ground terminal 326.

The second transistor 304 is an NPN transistor whose base terminal 304b receives the second input INM 310 and whose emitter terminal 304e is coupled to the plurality of impedance networks. A collector terminal 304c of the second transistor 304 is coupled to the power supply Vdd 320 through a second load resistor R12 318. A second biasing current source IM 324 is coupled between the emitter terminal 304e of the second transistor 304 and the ground terminal 326.

A first output node O1 is coupled between the first load resistor R11 316 and the collector terminal 302c of the first transistor 302. A second output node O2 is coupled between the second load resistor R12 318 and the collector terminal 304c of the second transistor 304. A first output OUTM 312 is generated at the first output node O1, and a second output OUTP 314 is generated at the second output node O2.

The plurality of impedance networks 308a, 308b, 308c to 308n are similar in connection and operation. For the sake of brevity of the description, the connection and operation of the impedance network 308a is described in detail. The impedance network 308a includes a first resistor R1 332, a second resistor R2 334 and a first switch S1 336. In one example, a resistance of the first resistor R1 332 and the second resistor R2 334 are equal.

The first resistor R1 332 is coupled between the first transistor 302 and the second resistor R2 334. The second resistor R2 334 is coupled between the first resistor R1 332 and a first node N1. The first switch S1 336 is coupled between the first node N1 and a second node N2. The second node N2 is coupled to the second transistor 304. The first load resistor R11 316 and the second load resistor R12 318 form an I2V (current to voltage) architecture of the amplifier 300.

The first transistor 302, the second transistor 304 and the plurality of impedance networks 308a, 308b, 308c to 308n form a V2I (voltage to current) architecture. A gain of the amplifier 300 is defined as a ratio of a resistance of the first load resistor R11 316 and an effective single ended impedance of the plurality of impedance networks. The gain programmability of the amplifier 300 is incorporated into the V2I architecture so as to maintain similar signal current level and signal to noise ratio (SNR) across different values of the gain.

The operation of the amplifier 300 illustrated in FIG. 3 is explained now. In one example, a voltage level used to discuss operation of the amplifier 300 is with respect to a common mode voltage. In another example, the first input INP 306 and the second input INM 310 are biased to the common voltage. The amplifier 300 is capable of single ended operation and differential operation. During the single ended operation, the first input INP 306 is greater than the second input INM 310. For example, the first input INP 306 is at a defined voltage level above common mode voltage, and the second input INM 310 is at common mode voltage. In one example, during the single ended operation, the first input INP 306 is less than the second input INM 310. During the differential operation, the first input INP 306 and the second input INM 310 are differential signals. For example, the first input INP 306 is at V/2 and the second input INM 310 is at −V/2, where V is a voltage level.

The first switch S1 336 is a MOS transistor. When activated, the first switch S1 336 has an ON switch resistance (Rsw). The first switch S1 336 has an associated switch capacitance (Csw). A swing in a voltage across the impedance network 308a causes variations in the ON switch resistance (Rsw) and switch capacitance (Csw). This variation in the ON switch resistance (Rsw) causes a distorted voltage across the first switch S1 336. For example, when the first switch S1 336 is a MOS transistor, a swing across the first switch S1 336 is at least one of swing across source-drain terminal, swing across gate-source terminal and swing across gate-drain terminal. A linearity degradation of the first switch S1 336 due to variation of the ON switch resistance (Rsw) causes much more distortion than the variation of the switch capacitance (Csw) at low frequencies.

During the differential operation, the first input INP 306 is at V/2 and the second input INM 310 is at −V/2, where V is a voltage level. In differential operation, when the first switch S1 336 is activated, a voltage at the first node N1 is −V/2, and a voltage at the second node N2 is −V/2. Thus, in this case, half swing exists across the first switch S1 336. This results in the ON switch resistance (Rsw) and the switch capacitance (Csw) non-linearites. The variation of the ON switch resistance (Rsw) causes much more distortion than the variation of the switch capacitance (Csw). This degrades the performance of the amplifier 300.

In differential operation, when the first switch S1 336 is inactivated, a voltage at the first node N1 is V/2, and a voltage at the second node N2 is −V/2. Thus, in this case, a large voltage swing exists across the first switch S1 336.

Since, the first switch S1 336 is inactivated, a non-linearity due to the ON switch resistance (Rsw) does not exist and a non-linearity due to the switch capacitance (Csw) is negligible at low frequencies. Hence, this does not degrade the performance of the amplifier 300.

In single ended operation, the first input INP 306 is at V volt and the second input INM 310 is at 0 volt. In single ended operation, when the first switch S1 336 is activated, a voltage at the first node N1 is 0 volt, and a voltage at the second node N2 is 0 volt. Thus, there is no voltage swing across the first switch S1 336, and hence no ON switch resistance (Rsw) and switch capacitance (Csw) non-linearites.

In single ended operation, when the first switch S1 336 is inactivated, a voltage at the first node N1 is V, and a voltage at the second node N2 is 0 volt. Thus, in this case, a large voltage swing exists across the first switch S1 336. Since, the first switch S1 336 is inactivated, a non-linearity due to the ON switch resistance (Rsw) does not exist and a non-linearity due to the switch capacitance (Csw) is negligible at low frequencies. Hence, this does not degrade the performance of the amplifier 300.

In single ended operation, the first switch S1 336 does not require bootstrapping. However, in differential operation, the first switch S1 336 requires bootstrapping. Bootstrapping is driving a gate terminal of the MOS transistor to track the voltage swing. Bootstrapping requires an additional power source, and a complex circuit to support the first switch S1 336. Thus, the amplifier 300 has multiple drawbacks which make its use for purpose of amplification unfavorable.

FIG. 4 illustrates an amplifier 400, according to an embodiment. The amplifier 400, in one example, is a low noise amplifier. The amplifier 400 includes a first transistor 402 and a second transistor 404. The first transistor 402 receives a first input INP 406, and the second transistor 404 receives a second input INM 410. The amplifier 400 includes a plurality of impedance networks represented as 408a, 408b, 408c to 408n. The plurality of impedance networks is coupled between the first transistor 402 and the second transistor 404.

The first transistor 402 is an NPN transistor whose base terminal 402b receives the first input INP 406, and whose emitter terminal 402e is coupled to the plurality of impedance networks. A collector terminal 402c of the first transistor 402 is coupled to a power supply Vdd 420 through a first load resistor R11 416. A first biasing current source IP 422 is coupled between the emitter terminal 402e of the first transistor 402 and a ground terminal 426.

The second transistor 404 is an NPN transistor whose base terminal 404b receives the second input INM 410 and whose emitter terminal 404e is coupled to the plurality of impedance networks. A collector terminal 404c of the second transistor 404 is coupled to the power supply Vdd 420 through a second load resistor R12 418. A second biasing current source IM 424 is coupled between the emitter terminal 404e of the second transistor 404 and the ground terminal 426. In one example, the first transistor 402 and the second transistor 404 are MOS transistors. In another example, each of the first transistor 402 and the second transistor 404 is a combination of transistors. In yet another example, a resistance of the first load resistor R11 416 is equal to a resistance of the second load resistor R12 418.

A first output node O1 is coupled between the first load resistor R11 416 and the collector terminal 402c of the first transistor 402. A second output node O2 is coupled between the second load resistor R12 418 and the collector terminal 404c of the second transistor 404. A first output OUTM 412 is generated at the first output node O1, and a second output OUTP 414 is generated at the second output node O2.

The plurality of impedance networks 408a, 408b, 408c to 408n are similar in connection and operation. For the sake of brevity of the description, the connection and operation of the impedance network 408a is described in detail. In one version, the plurality of impedance networks 408a, 408b, 408c to 408n are different in connection and operation. In another version, at least one impedance network of the plurality of impedance networks is similar to impedance network 408a in connection and operation. The impedance network 408a includes a first impedance path 430 and a second impedance path 440.

The first impedance path 430 includes a first impedance R1 432 and a first switch S1 434. The second impedance path 440 includes a second impedance R2 436, a second switch S2 438 and a third impedance R3 442. In one example, a resistance of the second impedance R2 436 and the third impedance R3 442 are equal. It is understood that the first impedance R1 432, the second impedance R2 436 and the third impedance R3 442 are shown as resistor for the sake of representation, and these can be individual or combination of a resistor, a capacitor and an inductor. In one example, the first impedance R1 432 is equal to the second impedance R2 436 and also equal to the third impedance R3 442.

The first impedance R1 432 is coupled between the first transistor 402 and a first node N1. The first switch S1 is coupled between the first node N1 and the second transistor 404. The second impedance R2 436 is coupled between the first transistor 402 and a second node N2. The second switch S2 438 is coupled between the second node N2 and a third node N3. The third impedance R3 442 is coupled between the third node N3 and the second transistor 404.

The first load resistor R11 416 and the second load resistor R12 418 form an I2V (current to voltage) architecture of the amplifier 400. The first transistor 402, the second transistor 404 and the plurality of impedance networks 408a, 408b, 408c to 408n form a V2I (voltage to current) architecture. A gain of the amplifier 400 is defined as a ratio of a resistance of the first load resistor R11 416 and an effective single ended impedance of the plurality of impedance networks. The gain programmability of the amplifier 400 is incorporated into the V2I architecture so as to maintain similar signal current level and signal to noise ratio (SNR) across different values of the gain.

The operation of the amplifier 400 illustrated in FIG. 4 is explained now. In one example, a voltage level used to discuss operation of the amplifier 400 is with respect to a common mode voltage. In another example, the first input INP 406 and the second input INM 410 are biased to the common voltage. The amplifier 400 is capable of single ended operation and differential operation. During the single ended operation, the first input INP 406 is greater than the second input INM 410. For example, the first input INP 406 is at a defined voltage level above common mode voltage, and the second input INM 410 is at common mode voltage. In one example, during the single ended operation, the first input INP 406 is less than the second input INM 410. During the differential operation, the first input INP 406 and the second input INM 410 are differential signals. For example, the first input INP 406 is at V/2 and the second input INM 410 is at −V/2, where V is a voltage level. In one example, V is a voltage level above a common mode voltage In one example, the first switch S1 434 and the second switch S2 438 are MOS transistors. When activated, these switches have an ON switch resistance (Rsw). Each of these switches has an associated switch capacitance (Csw). A swing in a voltage across the impedance network 408a causes variations in the ON switch resistance (Rsw) and switch capacitance (Csw). This variation in the ON switch resistance (Rsw) causes a distorted voltage across the first switch S1 434 and the second switch S2 438. For example, when the first switch S1 434 is a MOS transistor, a swing across the first switch S1 434 is at least one of swing across source-drain terminal, swing across gate-source terminal and swing across gate-drain terminal. A linearity degradation of these switches due to variation of the ON switch resistance (Rsw) causes much more distortion than the variation of the switch capacitance (Csw) at low frequencies.

In amplifier 400, the first impedance path 430 is activated during single ended operation, and the second impedance path 440 is activated during differential operation. During the differential operation, the first input INP 406 is at V/2 and the second input INM 410 is at −V/2, where V is a voltage level. In differential operation, when the first switch S1 434 is inactivated and the second switch S2 438 is activated, a voltage at the first node N1 is V/2, a voltage at the second node N2 is 0 volt, and a voltage at the third node N3 is 0 volt. Thus, in this case, full swing exists across the first switch S1 434, and no swing exists across the second switch S2 438. This means that a voltage swing across the second switch S2 438 is less than a voltage swing across the first switch S1 434. Thus the ON switch resistance (Rsw) and the switch capacitance (Csw) non-linearites does not affect a linearity of the amplifier 400 since only the second impedance path 440 is used during differential operation.

In differential operation, when both the first switch S1 434 and the second switch S2 438 are inactivated, a voltage at the first node N1 is V/2, a voltage at the second node N2 is V/2, and a voltage at the third node N3 is −V/2. Thus, a voltage swing across both the first switch S1 434 and the second switch S2 438 is equal.

In single ended operation, the first input INP 406 is at V volt and the second input INM 410 is at 0 volt. In single ended operation, when the first switch S1 434 is activated and the second switch S2 438 is inactivated, a voltage at the first node N1 is 0 volt, a voltage at the second node N2 is V volt, and a voltage at the third node N3 is 0 volt. Thus, there is no voltage swing across the first switch S1 434 and a full voltage swing exists across the second switch S2 438. This means that a voltage swing across the first switch S1 434 is less than a voltage swing across the second switch S2 438. Thus the ON switch resistance (Rsw) and the switch capacitance (Csw) non-linearites does not affect a linearity of the amplifier 400 since only the first impedance path 430 is used during single ended operation.

In single ended operation, when both the first switch S1 434 and the second switch S2 438 are inactivated, a voltage at the first node N1 is V volt, a voltage at the second node N2 is V volt, and a voltage at the third node N3 is 0 volt. Thus, a voltage swing across both the first switch S1 434 and the second switch S2 438 is equal.

During differential operation, the second impedance path 440 is activated, and hence the second switch S2 438 is activated, and no swing exists across the second switch S2 438 during differential operation. Hence, no bootstrapping is required for the second switch S2 438. During single ended operation, the first impedance path 430 is activated, and hence the first switch S1 434 is activated, and no swing exists across the first switch S1 434 during single ended operation. Hence, no bootstrapping is required for the first switch S1 434.

Thus, a size of the switches required in amplifier 400 is 2× lower than the switches required in amplifier 100. Also, in one example, the amplifier 400 does not require power for boot strapping which was required in the amplifier 100, amplifier 200 and amplifier 300. The amplifier 400 provides a good linearity both during the differential operation and the single ended operation, which make its use for the purpose of amplification favorable. A single impedance path results in non-linearity in the output signal when both the single ended operation and the differential operation are supported by the amplifier 400. Thus, the amplifier 400 provides 2 impedance paths. The first impedance path 430 is activated during single ended operation, and the second impedance path 440 is activated during differential operation. This improves the linearity of the amplifier 400.

FIG. 5 illustrates an amplifier 500, according to an embodiment. The amplifier 500, in one example, is a low noise amplifier. The amplifier 500 includes a first transistor 502 and a second transistor 504. The first transistor 502 receives a first input INP 506, and the second transistor 504 receives a second input INM 510. The amplifier 500 includes a plurality of impedance networks represented as 508*a*, 508*b*, 508*c* to 508*n*. The plurality of impedance networks is coupled between the first transistor 502 and the second transistor 504.

The first transistor 502 is an NPN transistor whose base terminal 502*b* receives the first input INP 506, and whose emitter terminal 502*e* is coupled to the plurality of impedance networks. A collector terminal 502*c* of the first transistor 502 is coupled to a power supply Vdd 520 through a first load resistor R11 516. A first biasing current source IP 522 is coupled between the emitter terminal 502*e* of the first transistor 502 and a ground terminal 526.

The second transistor 504 is an NPN transistor whose base terminal 504*b* receives the second input INM 510 and whose emitter terminal 504*e* is coupled to the plurality of impedance networks. A collector terminal 504*c* of the second transistor 504 is coupled to the power supply Vdd 520 through a second load resistor R12 518. A second biasing current source IM 524 is coupled between the emitter terminal 504*e* of the second transistor 504 and the ground terminal 526. In one example, the first transistor 502 and the second transistor 504 are MOS transistors. In another example, each of the first transistor 502 and the second transistor 504 is a combination of transistors. In yet another example, a resistance of the first load resistor R11 516 is equal to a resistance of the second load resistor R12 518.

A first output node O1 is coupled between the first load resistor R11 516 and the collector terminal 502*c* of the first transistor 502. A second output node O2 is coupled between the second load resistor R12 518 and the collector terminal 504*c* of the second transistor 504. A first output OUTM 512 is generated at the first output node O1, and a second output OUTP 514 is generated at the second output node O2.

The plurality of impedance networks 508*a*, 508*b*, 508*c* to 508*n* are similar in connection and operation. For the sake of brevity of the description, the connection and operation of the impedance network 508*a* is described in detail. In one version, the plurality of impedance networks 508*a*, 508*b*, 508*c* to 508*n* are different in connection and operation. In another version, at least one impedance network of the plurality of impedance networks is similar to impedance network 508*a* in connection and operation. The impedance network 508*a* includes a first impedance path and a second impedance path.

The first impedance path includes a first impedance R1 536, a second impedance R2 532 and a first switch S1 534. The second impedance path includes the first impedance R1 536, a second switch S2 538 and a third impedance R3 542. In one example, a resistance of the first impedance R1 536, the second impedance R2 532 and the third impedance R3 542 are equal. It is understood that the first impedance R1 536, the second impedance R2 532 and the third impedance R3 542 are shown as resistor for the sake of representation, and these can be individual or combination of a resistor, a capacitor and an inductor. In one example, the first impedance R1 536 is equal to the third impedance R3 542. In another example, the first impedance R1 536 is equal to the second impedance R2 532.

The first impedance R1 536 is coupled between the first transistor 502 and a second node N2. The second impedance R2 532 is coupled between the second node N2 and a first node N1. The first switch S1 534 is coupled between the first node N1 and the second transistor 504. The second switch S2 538 is coupled between the second node N2 and a third node N3. The third impedance R3 542 is coupled between the third node N3 and the second transistor 504.

The first load resistor R11 516 and the second load resistor R12 518 form an I2V (current to voltage) architecture of the amplifier 500. The first transistor 502, the second transistor 504 and the plurality of impedance networks 508*a*, 508*b*, 508*c* to 508*n* form a V2I (voltage to current) architecture. A gain of the amplifier 500 is defined as a ratio of a resistance of the first load resistor R11 516 and an effective single ended impedance of the plurality of impedance networks. The gain programmability of the amplifier 500 is incorporated into the V2I architecture so as to maintain similar signal current level and signal to noise ratio (SNR) across different values of the gain.

The operation of the amplifier 500 illustrated in FIG. 5 is explained now. In one example, a voltage level used to discuss operation of the amplifier 500 is with respect to a common mode voltage. In another example, the first input INP 506 and the second input INM 510 are biased to the common voltage. The amplifier 500 is capable of single ended operation and differential operation. During the single ended operation, the first input INP 506 is greater than the second input INM 510. For example, the first input INP 506 is at a defined voltage level above common mode voltage, and the second input INM 510 is at common mode voltage. In one example, during the single ended operation, the first input INP 506 is less than the second input INM 510. During the differential operation, the first input INP 506 and the second input INM 510 are differential signals. For example, the first input INP 506 is at V/2 and the second input INM 510 is at −V/2, where V is a voltage level. In one example, V is a voltage level above a common mode voltage In one example, the first switch S1 534 and the second switch S2 538 are MOS transistors. When activated, these switches have an ON switch resistance (Rsw). Each of these switches has an associated switch capacitance (Csw). A swing in a voltage across the impedance network 508*a* causes variations in the ON switch resistance (Rsw) and switch capacitance (Csw). This variation in the ON switch resistance (Rsw) causes a distorted voltage across the first switch S1 534 and the second switch S2 538. For example, when the first switch S1 534 is a MOS transistor, a swing across the first switch S1 534 is at least one of swing across source-drain terminal, swing across gate-source terminal and swing across gate-drain terminal. A linearity degradation of these switches due to variation of the ON switch resistance (Rsw) causes much more distortion than the variation of the switch capacitance (Csw) at low frequencies.

In amplifier 500, the first impedance path is activated during single ended operation, and the second impedance path is activated during differential operation. During the differential operation, the first input INP 506 is at V/2 and the second input INM 510 is at −V/2, where V is a voltage level. In differential operation, when the first switch S1 534 is inactivated and the second switch S2 538 is activated, a voltage at the first node N1 is 0 volt, a voltage at the second node N2 is 0 volt, and a voltage at the third node N3 is 0 volt. Thus, in this case, half swing exists across the first switch S1 534, and no swing exists across the second switch S2 538.This means that a voltage swing across the second switch S2 538 is less than a voltage swing across the first switch S1 534. Thus the ON switch resistance (Rsw) and the switch capacitance (Csw) non-linearites does not affect a linearity of the amplifier 500 since only the second impedance path is used during differential operation.

In differential operation, when both the first switch S1 534 and the second switch S2 538 are inactivated, a voltage at the first node N1 is V/2, a voltage at the second node N2 is V/2, and a voltage at the third node N3 is −V/2. Thus, a voltage swing across both the first switch S1 534 and the second switch S2 538 is equal.

In single ended operation, the first input INP 506 is at V volt and the second input INM 510 is at 0 volt. In single ended operation, when the first switch S1 534 is activated and the second switch S2 538 is inactivated, a voltage at the first node N1 is 0 volt, a voltage at the second node N2 is V/2 volt, and a voltage at the third node N3 is 0 volt. Thus, there is no voltage swing across the first switch S1 534 and a half voltage swing exists across the second switch S2 538. This means that a voltage swing across the first switch S1 534 is less than a voltage swing across the second switch S2 538. Thus the ON switch resistance (Rsw) and the switch capacitance (Csw) non-linearites does not affect a linearity of the amplifier 500 since only the first impedance path is used during single ended operation.

In single ended operation, when both the first switch S1 534 and the second switch S2 538 are inactivated, a voltage at the first node N1 is V volt, a voltage at the second node N2 is V volt, and a voltage at the third node N3 is 0 volt. Thus, a voltage swing across both the first switch S1 534 and the second switch S2 538 is equal.

During differential operation, the second impedance path is activated, and hence the second switch S2 538 is activated, and no swing exists across the second switch S2 538 during differential operation. Hence, no bootstrapping is required for the second switch S2 538. During single ended operation, the first impedance path is activated, and hence the first switch S1 534 is activated, and no swing exists across the first switch S1 534 during single ended operation. Hence, no bootstrapping is required for the first switch S1 534.

Thus, a size of the switches required in amplifier 500 is 2× lower than the switches required in amplifier 100. Also, in one example, the amplifier 500 does not require power for boot strapping which was required in the amplifier 100, amplifier 200 and amplifier 300. The amplifier 500 provides a good linearity both during the differential operation and the single ended operation, which make its use for the purpose of amplification favorable. A single impedance path results in non-linearity in the output signal when both the single ended operation and the differential operation are supported by the amplifier 500. Thus, the amplifier 500 provides 2 impedance paths. The first impedance path is activated during single ended operation, and the second impedance path is activated during differential operation. This improves the linearity of the amplifier 500.

FIG. 6 is a flowchart 600 illustrating a method, according to an embodiment. At step 602, a first input and a second input are provided to an amplifier. The amplifier includes an impedance network. For example, in amplifier 400, the first input INP 406 and the second input INM 410 are provided to the amplifier 400. In addition, the amplifier 400 includes an impedance network 408a. At step 604, a first impedance path in the impedance network is activated during single ended operation. The first impedance path includes a first switch. In amplifier 400, during single ended operation, the first impedance path 430 is activated, and first impedance path 430 includes a first switch S1.

At step 606, a second impedance path in the impedance network is activated during differential operation. The second impedance path includes a second switch. During the single ended operation the first switch is activated and the second switch is inactivated such that a voltage swing across the first switch is less than a voltage swing across the second switch.

For example, in amplifier 400, in single ended operation, when the first switch S1 434 is activated and the second switch S2 438 is inactivated, a voltage at the first node N1 is 0 volt, a voltage at the second node N2 is V/2 volt, and a voltage at the third node N3 is 0 volt. Thus, there is no voltage swing across the first switch S1 434 and a half voltage swing exists across the second switch S2 438.

This means that a voltage swing across the first switch S1 434 is less than a voltage swing across the second switch S2 438. Thus the ON switch resistance (Rsw) and the switch capacitance (Csw) non-linearites does not affect a linearity of the amplifier 400 since only the first impedance path 430 is used during single ended operation.

During differential operation, the second impedance path is activated, and hence the second switch is activated, and no swing exists across the second switch during differential operation. During single ended operation, the first impedance path is activated, and hence the first switch is activated, and no swing exists across the first switch during single ended operation.

FIG. 7 is a block diagram illustrating an example receiver 700 in which several aspects of the present invention can be implemented. The receiver 700 includes a receive antenna 702. A low noise amplifier (LNA) 704 is coupled between the receive antenna 702. An IF (intermediate frequency) filter 706 is coupled to the LNA 704. An analog to digital converter (ADC) 708 is coupled to the IF filter 706. A processor 710 is coupled to the ADC 708. The receiver 700 may include one or more additional components known to those skilled in the relevant art and are not discussed here for simplicity of the description.

The operation of the receiver 700 illustrated in FIG. 7 is explained now. The receive antenna 702 receives a signal and generates a first input and a second input. The LNA 704 receives the first input and the second input. The LNA 704 is similar in connection and operation to at least one of the amplifier 400 and amplifier 500. In one example, the LNA 704 processes the first input and the second input similar to the amplifier 400 processing the first input INP 406 and the second input INM 410.

The LNA 704 includes a first impedance path which is activated during single ended operation, and a second impedance path which is activated during differential operation. The IF filter generates a filtered non-zero IF signal from a signal received from the LNA 704. The ADC 708 samples the filtered non-zero IF signal to generate a valid data. The processor 710 process the valid data.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

The invention claimed is:

1. An amplifier comprising:
a first transistor having a first input;
a second transistor having a second input; and
an impedance network coupled between the first transistor and the second transistor, the impedance network including:
a first impedance path including a first impedance coupled between a terminal of the first transistor and a first node, a second impedance coupled between the first node and a second node, and a first switch coupled between the second node and a terminal of the second transistor; and
a second impedance path including the first impedance coupled between the terminal of the first transistor and the first node, a second switch coupled between the first node and a third node, and a third impedance coupled between the third node and the terminal of the second transistor.

2. The amplifier of claim 1, wherein the first impedance path is configured to be activated during single ended operation, and wherein a signal at the first input is greater than a signal at the second input during the single ended operation.

3. The amplifier of claim 1, wherein the second impedance path is configured to be activated during differential operation, and wherein signals at the first input and the second input are differential signals during the differential operation.

4. The amplifier of claim 1, wherein the first transistor is an NPN transistor whose base terminal forms the first input, whose first terminal is an emitter terminal that is coupled to the impedance network and whose collector terminal is coupled to a power supply through a first load resistor.

5. The amplifier of claim 4, further comprising a first biasing current source coupled between the emitter terminal of the first transistor and a ground terminal.

6. The amplifier of claim 1, further comprising:
a first output node coupled between a first load resistor and the collector terminal of the first transistor, wherein a first output is generated at the first output node; and
a second output node coupled between a second load resistor and the collector terminal of the second transistor, wherein a second output is generated at the second output node.

7. The amplifier of claim 1, wherein during single ended operation, the first switch is activated and the second switch is inactivated such that a voltage swing across the first switch is less than a voltage swing across the second switch.

8. The amplifier of claim 1, wherein during single ended operation, each of the first switch and the second switch is inactivated such that a voltage swing across both the first switch and the second switch is equal.

9. The amplifier of claim 1, wherein during differential operation, the first switch is inactivated and the second switch is activated such that a voltage swing across the second switch is less than a voltage swing across the first switch.

10. The amplifier of claim 1, wherein during differential operation, each of the first switch and the second switch is inactivated such that a voltage swing across both the first switch and the second switch is equal.

11. A receiver comprising:
a receive antenna configured to receive a signal and configured to generate a first input and a second input;
an amplifier coupled to the receive antenna, the amplifier comprising:
a first transistor configured to receive the first input;
a second transistor configured to receive the second input; and
an impedance network coupled between the first transistor and the second transistor, the impedance network comprising:
a first impedance path including a first impedance coupled between a terminal of the first transistor and a first node, a second impedance coupled between the first node and a second node, and a first switch coupled between the first node and a terminal of the second transistor; and
a second impedance path including the first impedance coupled between the terminal of the first transistor and the first node, a second switch coupled between the first node and a third node, and a third impedance coupled between the third node and the terminal of the second transistor;
an IF filter coupled to the amplifier and configured to generate a filtered non-zero IF signal from a signal received from the amplifier;
an ADC (analog to digital converter) coupled to the IF filter and configured to sample the filtered non-zero IF signal to generate a valid data; and
a processor coupled to the ADC and configured to process the valid data.

12. An amplifier comprising:
a first transistor having a first input;
a second transistor having a second input; and
an impedance network coupled between the first transistor and the second transistor the impedance network including:
a first impedance path including a first impedance coupled between a terminal of the first transistor and a first node, and a first switch coupled between the second node and a terminal of the second transistor; and
a second impedance path including a second impedance coupled between the terminal of the first transistor and a second node, a second switch coupled between the second node and a third node, and a third impedance coupled between the third node and the terminal of the second transistor.

13. The amplifier of claim 12, wherein the first impedance path is configured to be activated during single ended operation, and wherein a signal at the first input is greater than a signal at the second input during the single ended operation.

14. The amplifier of claim 12, wherein the second impedance path is configured to be activated during differential operation, and wherein signals at the first input and the second input are differential signals during the differential operation.

15. The amplifier of claim 12, wherein the first transistor is an NPN transistor whose base terminal forms the first input, whose first terminal is an emitter terminal that is coupled to the impedance network and whose collector terminal is coupled to a power supply through a first load resistor.

16. The amplifier of claim 15, further comprising a first biasing current source coupled between the emitter terminal of the first transistor and a ground terminal.

17. The amplifier of claim 12, further comprising:
a first output node coupled between a first load resistor and the collector terminal of the first transistor, wherein a first output is generated at the first output node; and
a second output node coupled between a second load resistor and the collector terminal of the second transistor, wherein a second output is generated at the second output node.

18. The amplifier of claim 12, wherein the first impedance path is configured to be activated during single ended operation, and wherein the second impedance path is configured to be activated during differential operation.

19. The amplifier of claim 1, wherein the first impedance path is configured to be activated during single ended operation, and wherein the second impedance path is configured to be activated during differential operation.

* * * * *